(12) United States Patent
Painter et al.

(10) Patent No.: US 8,637,433 B2
(45) Date of Patent: Jan. 28, 2014

(54) METHOD FOR MAKING A COMPOSITE HIGH-TEMPERATURE SUPERCONDUCTOR

(75) Inventors: Thomas Painter, Tallahassee, FL (US); Ting Xu, Knoxville, TN (US); Xiaotao Liu, Raleigh, NC (US)

(73) Assignee: Florida State University Technology Transfer Office, Tallahassee, FL (US)

( * ) Notice: Subject to any disclaimer, the term of this patent is extended or adjusted under 35 U.S.C. 154(b) by 28 days.

(21) Appl. No.: 13/252,749

(22) Filed: Oct. 4, 2011

(65) Prior Publication Data

US 2012/0083416 A1    Apr. 5, 2012

Related U.S. Application Data

(60) Provisional application No. 61/389,413, filed on Oct. 4, 2010.

(51) Int. Cl.
*C04B 35/45* (2006.01)
(52) U.S. Cl.
USPC .......................................................... 505/492

(58) Field of Classification Search
USPC .................... 505/490, 492, 500, 501; 29/599
See application file for complete search history.

(56) References Cited

U.S. PATENT DOCUMENTS

| | | | | |
|---|---|---|---|---|
| 2009/0209428 A1* | 8/2009 | Kikuchi | ......................... | 505/430 |
| 2011/0136673 A1* | 6/2011 | Ayai | .............................. | 505/230 |
| 2012/0172230 A1* | 7/2012 | Tatamidani et al. | .......... | 505/121 |

\* cited by examiner

*Primary Examiner* — Colleen Dunn
(74) *Attorney, Agent, or Firm* — J. Wiley Horton

(57) ABSTRACT

A method for making a composite superconductor and a superconductor made using the method. Superconducting filaments are embedded in a matrix material. Oxygen-containing elements are also embedded in the matrix material, with the oxygen-containing elements preferably being dispersed evenly among the superconducting filaments. A surrounding reinforcement material contains the other elements and preferably seals the superconductor from the surrounding atmosphere.

13 Claims, 1 Drawing Sheet

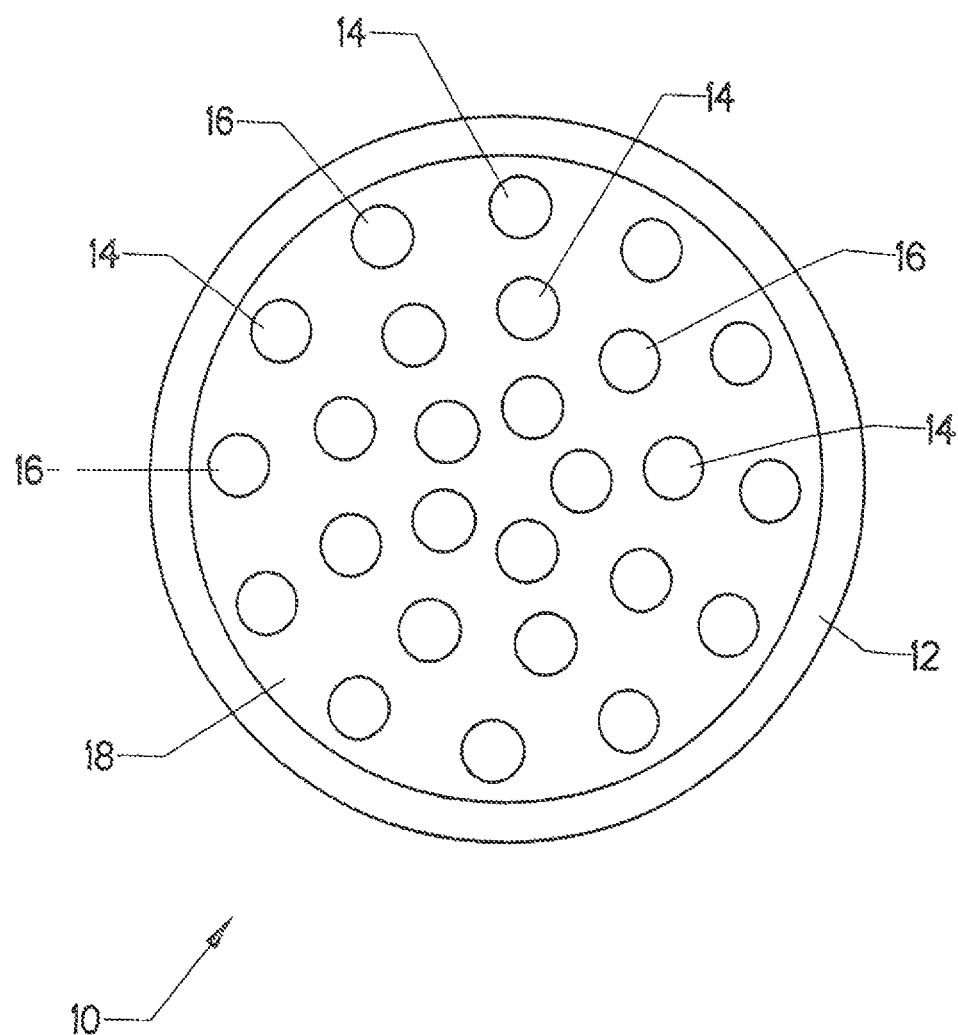

METHOD FOR MAKING A COMPOSITE HIGH-TEMPERATURE SUPERCONDUCTOR

CROSS-REFERENCES TO RELATED APPLICATIONS

This is a non-provisional application claiming the benefit of an earlier-filed provisional application pursuant to the terms of 37 C.F.R. §1.53 (c). The provisional application was assigned Ser. No. 61/389,413 filed on Oct. 4, 2010. It listed the same inventors.

STATEMENT REGARDING FEDERALLY SPONSORED RESEARCH OR DEVELOPMENT

This invention was developed at the National High Magnetic Field Laboratory in Tallahassee, Fla. The research and development has been federally sponsored under contract number DMR-0654119 awarded by the National Science Foundation. The United States government has certain rights in the invention.

MICROFICHE APPENDIX

Not Applicable

BACKGROUND OF THE INVENTION

1. Field of the Invention

This invention relates to the field of high-temperature superconductors. More specifically, the invention comprises a method for making a reinforced composite Bi2212 superconductor using an embedded internal oxygen source.

2. Description of the Related Art

Composite conductors for use in electromagnets are well known in the art. The term "composite" is intended to encompass a structure containing two or more different materials formed into a unified assembly. It is known to use bismuth compounds to create a high-temperature superconducting cables. Bi2212 wire has been used for this purpose.

The Bi2212 wire is combined with other materials—such as a copper or silver matrix—and progressively passed through forming processes to bond the materials together longitudinally. One example is the use of drawing dies to compress a bundle of round conductors and cause the constituents to plastically deform around each other and thereby create a unified whole.

Those skilled in the art will know that heat treatment processes are typically employed when forming a Bi-2212 composite conductor. Existing Bi2212 wires require an external oxygen supply during the heat treatment process. These processes are typically performed in a 100% oxygen atmosphere or at least an atmosphere containing a significant amount of oxygen. The oxygen is chemically active at the temperatures required for the heat treatment and will often react with other materials to produce unwanted results. This fact limits the component design choices available, since the undesired oxidation of some components must be considered. The present invention seeks to reduce this problem by providing an internal oxygen source within the composite conductor in combination with an external barrier on the outer diameter of the composite that is impervious to oxygen to prevent migration of the oxygen out of the composite.

BRIEF SUMMARY OF THE INVENTION

The present invention comprises a method for making a composite superconductor and a superconductor made using the method. Superconducting filaments (using a material such as Bi2212) are embedded in a silver-containing matrix material (which may be substantially pure silver). Oxygen-containing filaments are also embedded in the matrix material, with the oxygen-containing filaments preferably being dispersed evenly among the Bi2212 wire. A surrounding reinforcement material contains the other elements and preferably seals the superconductor from the surrounding atmosphere.

The composite superconductor is created using any suitable process, such as passing the constituents through one or more drawing dies. Once the materials are bonded together, the composite superconductor is subjected to one or more heat treatment processes. The oxygen within the oxygen-containing filaments reacts with the Bi2212 to form desired superconducting materials.

BRIEF DESCRIPTION OF THE SEVERAL VIEWS OF THE DRAWINGS

FIG. 1 shows a cross section of a composite superconductor made according to the present invention.

| REFERENCE NUMERALS IN THE DRAWINGS | | | |
|---|---|---|---|
| 10 | composite superconductor | 12 | reinforcement material |
| 14 | Bi2212 filament | 16 | internal oxygen supply |
| 18 | silver matrix material | | |

DETAILED DESCRIPTION OF THE INVENTION

FIG. 1 shows a cross-section of a composite superconductor made according to the present invention. Those skilled in the art will know that such assemblies are often made by arranging radial arrays of linear filaments and plastically deforming these filaments into a unified whole using drawing dies or other known techniques. Silver matrix material 18 fills the voids between the other elements. This is typically substantially pure silver or a silver alloy.

Filaments made of superconducting material are dispersed within silver matrix material 18. In the particular embodiment shown, Bi2212 elements 14 are dispersed in a series of radial arrays. These are shown as being evenly spaced, although those familiar with the manufacturing techniques will realize that some variations will inevitably be present.

Different manufacturing methods can be used to produce the array shown in FIG. 1, and the novelty of the invention is not tied to any one method. However, as the reader's understanding may benefit, one method will be described in detail. Silver matrix material 18 is made in the form of an elongated cylinder having a plurality of holes which are parallel to the cylinder's central axis. Some of the holes are filled by Bi2212 filaments 14. Some of the holes are filled by the filaments comprising internal oxygen supply 16. The assembly is then drawn through a diameter-reducing die (or several progressively smaller dies in sequence). The drawing process plastically deforms the constituents into a unified whole. The diameter is preferably reduced and the length is preferably increased.

Reinforcement material 12 surrounds and encases the other components, and preferably seals the internal components from the external atmosphere. The reinforcement material may be added during the drawing process or by a subsequent operation. Internal oxygen supply 16 assumes the form of oxygen-containing filaments which are dispersed within silver matrix material 18. The oxygen-containing filaments produce free oxygen during heat treatment processes, and this free oxygen mitigates parasitic losses of oxygen from the initial filamentary powder and reacts with the Bi2212 filaments to produce desired superconducting compounds.

As an example, silver oxide can be used as internal oxygen supply 16. When the assembly is heated, the oxygen breaks free of the silver at temperatures below those used for heat treating the Bi2212 filaments. Thus, the desired free oxygen is produced as the temperature within the assembly is rising toward the Bi2212 heat treatment temperature.

The provision of an internal oxygen supply within the composite matrix allows the desired oxygen-based reactions while reducing and/or eliminating undesired oxygen-based reactions. The reader will note that the particular arrangement of Bi2212 filaments and internal oxygen supply filaments is not specified in detail in FIG. 1. Different physical arrangements of the filaments—as well as different proportions of superconducting filaments to oxygen supply filaments—will be applicable to particular circumstances. The invention is not limited to any one particular arrangement or type of arrangement. Likewise, the invention is not limited to the use of Bi2212 filaments or silver oxides, but should instead be properly viewed as applying to many different types of materials.

Although the preceding description contains significant detail, it should not be viewed as limiting the scope of the invention but rather as providing illustrations of the preferred embodiments of the invention. For example, numerous other oxygen-containing compounds could be substituted for the specific examples provided. Thus, the scope of the invention should be fixed by the following claims rather than by the examples given.

Having described our invention, we claim:

1. A method for increasing oxygen concentration in a superconductor, comprising:
   a. providing a matrix material having a central axis;
   b. embedding a plurality of superconducting filaments in said matrix material, each of said superconducting filaments being parallel to said central axis of said matrix material;
   c. embedding a plurality of oxygen-containing filaments in said matrix material, each of said oxygen-containing filaments being parallel to said central axis of said matrix material;
   d. plastically deforming said matrix material, said plurality of superconducting filaments, and said plurality of oxygen-containing filaments into a unified assembly;
   e. encasing said unified assembly in a reinforcement material which separates said unified assembly from an external atmosphere;
   f. heating said unified assembly to a temperature sufficient to break at least a portion of the oxygen contained in said oxygen-containing filaments free from said oxygen-containing filaments; and
   g. said free oxygen passing through said matrix material and reacting with said superconducting filaments to increase an oxygen concentration of said superconducting filaments.

2. A method for making a superconductor as recited in claim 1, wherein said superconducting filaments are made of Bi2212.

3. A method for making a superconductor as recited in claim 1, wherein said oxygen-containing filaments are made of silver oxide.

4. A method for making a superconductor as recited in claim 2, wherein said oxygen-containing filaments are made of silver oxide.

5. A method for making a superconductor as recited in claim 1, wherein:
   a. said matrix material includes a plurality of holes parallel to said central axis;
   b. said superconducting filaments are placed in some of said plurality of holes;
   c. said oxygen-containing filaments are placed in some of said plurality of holes; and
   d. said step of plastically deforming said matrix material, said plurality of superconducting filaments, and said plurality of oxygen-containing filaments is performed by drawing.

6. A method for making a superconductor as recited in claim 4, wherein said step of heating is performed after said step of drawing.

7. A method for increasing oxygen concentration in a superconductor, comprising:
   a. providing a matrix material having a central axis;
   b. providing a plurality of superconducting filaments evenly dispersed within said matrix material, each of said superconducting filaments being parallel to said central axis of said matrix material;
   c. providing a plurality of oxygen-containing filaments evenly dispersed within said matrix material, each of said oxygen-containing filaments being parallel to said central axis of said matrix material;
   d. plastically deforming said matrix material, said plurality of superconducting filaments, and said plurality of oxygen-containing filaments into a unified assembly;
   e. encasing said unified assembly in a reinforcement material which separates said unified assembly from an external atmosphere;
   f. heating said unified assembly to a temperature sufficient to break at least a portion of the oxygen contained in said oxygen-containing filaments free from said oxygen-containing filaments; and
   g. said free oxygen passing through said matrix material and reacting with said superconducting filaments to increase an oxygen concentration of said superconducting filaments.

8. A method for making a superconductor as recited in claim 7, wherein said superconducting filaments are made of Bi2212.

9. A method for making a superconductor as recited in claim 7, wherein said oxygen-containing filaments are made of silver oxide.

10. A method for making a superconductor as recited in claim 8, wherein said oxygen-containing filaments are made of silver oxide.

11. A method for making a superconductor as recited in claim 7, wherein:
    a. said matrix material includes a plurality of holes parallel to said central axis;
    b. said superconducting filaments are placed in some of said plurality of holes;
    c. said oxygen-containing filaments are placed in some of said plurality of holes; and
    d. said step of plastically deforming said matrix material, said plurality of superconducting filaments, and said plurality of oxygen-containing filaments is performed by drawing.

12. A method for making a superconductor as recited in claim 11, wherein said step of heating is performed after said step of drawing.

13. A method for increasing oxygen concentration in a superconductor, comprising:
    a. providing a silver matrix material having a central axis;

b. embedding a plurality of Bi-2212 superconducting filaments in said matrix material, each of said Bi-2212 superconducting filaments being parallel to said central axis of said matrix material;
c. embedding a plurality of silver oxide-containing filaments in said matrix material, each of said silver oxide-containing filaments being parallel to said central axis of said matrix material;
d. plastically deforming said silver matrix material, said plurality of B-2212 superconducting filaments, and said plurality of silver oxide-containing filaments into a unified assembly wherein said plurality of Bi-2212 superconducting filaments and said plurality of silver oxide-containing filaments are evenly distributed throughout said silver matrix material;
e. encasing said unified assembly in a reinforcement material which separates said unified assembly from an external atmosphere;
f. heating said unified assembly to a temperature sufficient to break at least a portion of the oxygen contained in said oxygen-containing filaments free from said oxygen-containing filaments;
g. said free oxygen passing through said matrix material and reacting with said superconducting filaments to increase an oxygen concentration of said superconducting filaments.

* * * * *